Aug. 31, 1965 H. SCHREINER ETAL 3,204,158

SEMICONDUCTOR DEVICE

Filed June 16, 1961

3,204,158

SEMICONDUCTOR DEVICE

Horst Schreiner, Nurnberg, and Hans Schering, Berlin-Haselhorst, Germany, assignors to Siemens-Schuckertwerke Aktiengesellschaft, Berlin-Siemensstadt, Germany, a corporation of Germany Filed June 16, 1961, Ser. No. 117,618
Claims priority, application Germany, June 21, 1960, S 69,028
11 Claims. (Cl. 317—234)

Our invention relates to rectifiers, transistors, and other electronic semiconductor devices, particularly those that are subjected to varying temperatures when in use.

The contacted areas of semiconductor bodies in such devices, especially when large-area contact engagements are involved, encounter trouble in the event of thermal alternating stresses, due to the different thermal coefficients of expansion of the respective materials adjacent to each other. Such problems occur particularly with semiconductor devices in electric power circuits, for example power transistors and power rectifiers. Thus, silicon has a coefficient of expansion greatly different from the coefficients of the contacting metals such as tungsten or molybdenum, and also from the coefficients of expansion of such carrier metals as copper or silver, as well as those of metals which, like iron and brass, are often used for the housing of such devices. As a result, thermal alternating stresses may cause damage or destruction of a semiconductor device composed of these different substances.

Various proposals have become known for eliminating the above-mentioned difficulties. According to one of these, silicon rectifiers are provided with carrier plates consisting of a sintered structure of tungsten, molybdenum or chromium, filled with a good conducting metal. This affords a relatively good adaptation to the thermal expansion coefficient of the semiconductor body, but not at the junction of the carrier plate or housing if the latter consists of coper or silver, for example.

It is an object of our invention, relating to an electronic semiconductor device particularly of the type subjected to thermal alternating stresses, to virtually fully eliminate the above-mentioned difficulties.

To this end, and in accordance with a feature of our invention, we provide between the semiconductor body and the adjacent contact carrier a sintered, porous intermediate plate structure of a metal or alloy which is readily deformable plastically. That is, this material must have a plastic deformability at least equal to that of nickel. The sintered structure is preferably given a degree of porosity between about 15 and about 30%. If it is directly adjacent to the semiconductor body, it is preferably joined therewith by tin solder or the like soft solder. The invention is particularly favorable with silicon rectifiers.

Suitable as starting powder for producing the sintered intermediate plates for the purposes of our invention are copper, silver, gold and aluminum, the use of copper or silver being preferable. Also suitable are powdered, plastically deformable alloys consisting, for example, of the just-mentioned elemental metals as a base and of plasticizing metal additions, for example nickel. Applicable as plasticizing additions are those which increase the mechanical strength of the porous intermediate plate while preserving its plastic properties at the proper temperatures. The amount of added metal is preferably kept rather small, namey not higher than about 5 parts by weight. Suitable, for example, is an alloy powder of Ag/Cu/Ni in the proportions of 89:10:1 or 10:88:2 by weight.

By virtue of the structural design of the intermediate plates used according to the invention, the respectively different thermal expansion coefficients of the mutually contacting semiconductor and carrier substances are bridged by a kind of accordion or buffer effect which eliminates to a great extent the deterioration in properties of the semiconductor device, for example a silicon rectifier, otherwise occurring as a result of mehanical tension. This is important particularly because the elasticity range of semiconductor materials is relatively slight. The elastic deformations of a body within Hooke's range are reversible and are proportional to the magnitude of the mechanical tension applied. However, if a deformation-responsive voltage drop or other electrical parameter value of a semiconductor device is measured with sufficient accuracy, it is found that a permanent deformation already occurs within Hooke's range. Such permanent deformation may be due, for example, to dislocations, namely changes in concentration and local distribution of lattice defections. In addition, an increasing thermal alternating stress, for example when the semiconductor device is operated in on-off performance, the soft-solder layer may also become damaged by the occurring mechanical tensions. Thus, for example in a silicon rectifier for known design, a few hundred alternations of 100° C. down to room temperature (20° C.) may already lead to considerable damage or complete defection of the rectifier.

The above-mentioned detrimental phenomona are buffered by the porous intermediate plate provided according to the present invention. This is due to the fact that the intermediate plates, by plastic deformation in the microranges, compensate the occurring mechanical tension. The intermediate plates have been found to retain this property even when the plates are subjected to a large number of temperature changes. That is, these plates virtually suffer no fatigue phenomena.

For further explanation of the invention reference is made to the accompanying drawing in which.

Figure 1:
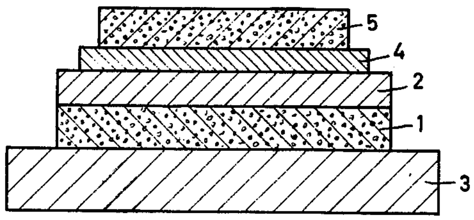
FIG. 1 shows schematically the design of a rectifier element according to the invention.

The rectifier element shown in FIG. 1 comprises an intermediate plate 1 according to the invention. The plate 1 may be made of copper powder with porosity degree of 0.20. The plate 1 is joined in face-to-face relation with a molybdenum disc 2 and with a carrier plate 3 of copper. Placed upon the molybdenum disc 2 is a semiconductor body 4. Bonded to the top surface of the semiconductor body is another intermediate plate 5 according to the invention. The plate 5 may be made of copper powder and may be given a porosity degree of 0.26. All illustrated components are of circular shape. The intermediate plate 5, serving as a contact or electrode for the semiconductor plate 4 is joined therewith by soft solder. The other parts can be joined together either by soft-soldering, hard-soldering or brazing. The p-n junction of the semiconductor 4 may be produced in any known manner. For example, when the semiconductor body 4 consists of silicon, the p-n junction may be produced by the alloying method, namely by alloying an aluminum foil to one flat side of the body 4, and a foil of antimony-containing gold to the other side. The p-n junction may also be produced by alloying a boron-containing gold foil together with one side of the semiconductor body, and an antimony-containing gold foil together with the other side of the body. These and other methods of producing a p-n junction are known as such and not essential to the present invention proper.

The above-mentioned intermediate plates of porous copper can be produced as follows.

Electrolysis-copper powder of a grain size below 60 microns is pressed in a mold at a pressure of 2 t./m.$^2$ (pressing density 6.10 g./cm.$^3$). The body thus pressed and shaped is sintered at 800° C. in hydrogen for one hour. This increases the density to 7.18 g./cm.$^3$ which corresponds to a space-filling degree of 0.803 and a porosity degree of 0.917.

The resulting plate corresponds to the one denoted by 1 in FIG. 1. In order to obtain the porosity degree of 0.26 desirable for the second intermediate plate (5 in FIG. 1), a molding pressure of about 2.5 t./cm.$^2$ is used in a process otherwise identical with the one just described.

The soft-soldering of the plates is preferably effected as follows. The porous sintered plate is first covered with a thin coat of lead-tin solder. For this purpose an ample quantity of lead-tin solder is melted onto the plate, and the excess is brushed off with a brass-wire brush, so that a thin coating (thinner than 100 microns) covers both surfaces of the porous plates. The soft-soldering of the plate to the adjacent parts is then effected in the conventional manner.

As a rule, the plate 1 has a thickness of 1.5 to 3.5 mm., the molybdenum disc 2 is 0.5 to 2 mm. thick, and the semiconductor body 4 may have a thickness of 0.2 mm. and a diameter of 20 mm. The thickness of layers 3 and 5 can be adapted to any particular requirements.

Figures 2, 3:
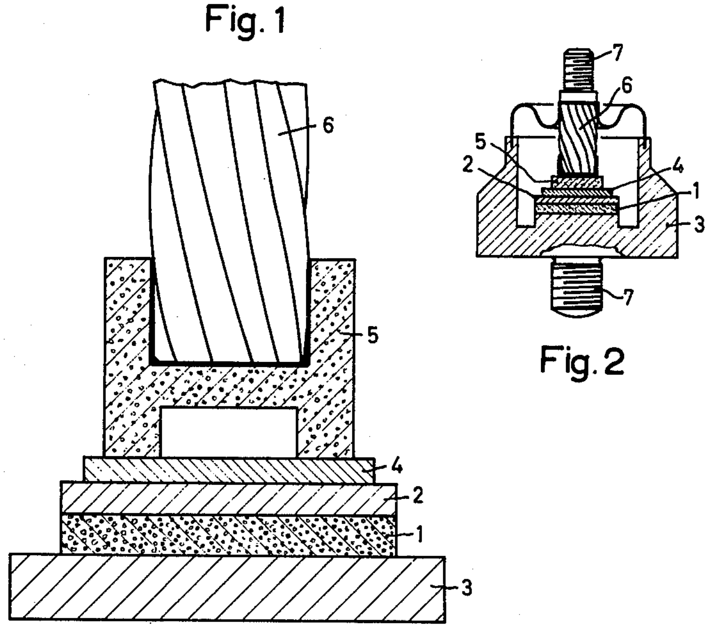
FIG. 2 is a sectional view of a complete rectifier comprising an element according to FIG. 1.
FIG. 3 illustrates in section and schematically another embodiment of a rectifier according to the invention.

The carrier, denoted by 3 in FIG. 1 may also be constituted by a housing as shown in FIG. 2 where the corresponding component is denoted by 3'. The intermediate plate 5 is connected with a stranded and flexible current-supply member 6. The connecting terminals of the illustrated rectifier unit consists of threaded copper bolts 7 and 7'. The components denoted by the other reference numerals in FIG. 2 correspond to those identified by the same respective numerals in FIG. 1. This also applies to the embodiment shown in FIG. 3 in which the intermediate porous plate 5' is designed as a tubular structure to directly receive the end of the flexible current-supply member 6.

When the semiconductor bodies have relatively small areas, for example, below 2 cm.$^2$, the porous intermediate plates can be soft soldered directly to the semiconductor body. In this case it is preferable to give the intermediate plates a higher degree of porosity, for example between 0.25 and 0.50. For this purpose, in the example described above, the electrolysis-copper powder is subjected to a pressure of 0.5 t./cm.$^2$ (pressure density 4.33 g./cm.$^3$) and is sintered at 700° C. in hydrogen for about 1 hour. This results in a sintering density of 4.85 g./cm.$^3$, corresponding to a space-filling degree of 0.543 and a porosity degree of 0.457.

As mentioned above, the electrically good conducting metals copper, silver, gold and aluminum and their electrically good conducting alloys are applicable for producing sintered intermediate plates according to the invention. However, suitable for directly contacting a body of a given semiconductor material are only such metals that have a negligibly small diffusion constant in this particular semiconductor material. If this requirement is not met, the metal can be employed only if an auxiliary metal layer or coating, to act as a diffusion barrier, is disposed between the semiconductor body and the sintered intermediate body. For example, when the semiconductor body consists of silicon and the sintered intermediate plate according to the invention is to be made of aluminum, it is necessary to prevent diffusion of the aluminum into the silicon by inserting between the semiconductor body and the intermediate plate a diffusion-barrier layer of nickel or chromium having about 0.1 mm. thickness.

The above-mentioned plasticizing effect of the nickel addition is due to the resulting refinement in granular texture of the resulting nickel alloy. This renders the bridges within the sintered porous structure more readily deformable. Nickel is soluble only to a slight extent in the system Ag-Cu. It is preferable to make the nickel addition not greater than corresponds to its solubility.

Accordingly, the selection of a plasticizing metallic addition to the material of the sintered plate should follow the general rule that the addition must result in granular refinement of the resulting alloy.

In addition to the above-mentioned advantages of electronic semiconductor devices with porous intermediate plates according to the invention, these devices exhibit a considerably better electrical and thermal conductivity than the above-mentioned known carrier plates made of sintered skeleton structure of tungsten, molybdenum or chromium filled with good conducting metal. This results in improved heat dissipation from the semiconductor device to the heat sink upon which is mounted when in use, as well as a reduction in the equilibrium temperature.

We claim:

1. An electronic semiconductor device having an elevated temperature during normal operation, comprising a semiconductor plate, a metallic contact body having an area in face-to-face relation to a surface of said plate, and an intermediate member disposed between said plate and said body and conductively bonded to both, said member consisting substantially of a sintered porous plate structure of metal more readily deformable plastically than said plate and body.

2. An electronic semiconductor device having an elevated temperature during normal operation, comprising a semiconductor plate, a metallic contact body having an area in face-to-face relation to a surface of said plate, and an intermediate member disposed between said plate and said body and conductively bonded to both, said member consisting substantially of a sintered porous plate structure of electrically good-conducting metal having a plastic deformability at least equal to that of nickel.

3. An electronic semiconductor device having an elevated temperature during normal operation, comprising a semiconductor plate, two contact terminal bodies of metal having respective areas in face-to-face relation to the respective faces of said semiconductor plate, and two intermediate members disposed between said semiconductor plate and said respective terminal bodies and conductively bonded thereto, each of said intermediate members consisting of a sintered porous plate structure of electrically good conducting metal more readily deformable plastically than said plate and bodies.

4. An electronic semiconductor device having an elevated temperature during normal operation, comprising a semiconductor plate, a metallic contact body having an area in face-to-face relation to a surface of said plate, and an intermediate member disposed between said plate and said body and conductively bonded to both, said member consisting substantially of a sintered porous structure of metal selected from the group consisting of copper, silver and copper-silver alloys.

5. In a semiconductor device according to claim 4, said sintered structure having a degree of porosity between about 15 and about 30%.

6. In a semiconductor device according to claim 1, said sintered porous plate structure being bonded by soft solder directly to said semiconductor plate.

7. A semiconductor device according to claim 1, comprising a metal plate between said semiconductor plate and said porous plate structure, said metal plate consisting of a metal having a higher melting point and less ductibility than said metal of said porous structure.

8. A semiconductor device according to claim 1, comprising a molybdenum plate between said semiconductor plate and said porous structure.

9. A rectifier comprising a silicon plate, two contact terminal bodies of metal having respective areas in face-to-face relation to the respective faces of said semiconductor plate, and two intermediate members disposed between said semiconductor plate and said respective terminal bodies and conductively bonded thereto, each of said intermediate members consisting of a sintered porous structure of metal selected from the group consisting of copper, silver and copper-silver alloys.

10. An electronic semiconductor device having an elevated temperature during normal operation, comprising a semiconductor plate, a metallic contact body having an area in face-to-face relation to a surface of said plate, and an intermediate member disposed between said plate and said body and conductively bonded to both, said member consisting of a sintered porous structure of a copper-silver alloy which contains an addition of from effective traces up to about 5 parts by weight of another metal having grain refining action upon the alloy.

11. An electronic semiconductor device having an elevated temperature during normal operation, comprising a semiconductor plate, a metallic contact body having an area in face-to-face relation to a surface of said plate, and an intermediate member disposed between said plate and said body and conductively bonded to both, said member consisting of a sintered porous structure of a copper-silver alloy which contains an addition of nickel in an amount of about one to about two parts by weight.

References Cited by the Examiner

UNITED STATES PATENTS

| | | | |
|---|---|---|---|
| 2,362,353 | 11/44 | Cate | 75—208 X |
| 2,462,906 | 3/49 | Sauerborn | 75—208 |
| 2,946,935 | 7/60 | Finn | 317—234 |

JOHN W. HUCKER, *Primary Examiner.*

BENNETT G. MILLER, *Examiner.*